United States Patent
Chen et al.

(10) Patent No.: US 11,265,039 B2
(45) Date of Patent: Mar. 1, 2022

(54) LOW NOISE AMPLIFIER PROTECTION

(71) Applicant: Nokia Solutions and Networks Oy, Espoo (FI)

(72) Inventors: Lihuan Chen, Hangzhou (CN); Sumin Yuan, Hangzhou (CN); Jun Ji, Hangzhou (CN)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 17/165,205

(22) Filed: Feb. 2, 2021

(65) Prior Publication Data

US 2021/0159937 A1  May 27, 2021

Related U.S. Application Data (63) Continuation of application No. 16/637,317, filed as application No. PCT/EP2018/071875 on Aug. 13, 2018, now abandoned.

(30) Foreign Application Priority Data

Aug. 15, 2017 (CN) .......................... 201710697322.X (51) Int. Cl.
*H04B 1/48* (2006.01)
*H04B 1/10* (2006.01)
*H03F 1/52* (2006.01)

(52) U.S. Cl.
CPC ............... *H04B 1/48* (2013.01); *H03F 1/523* (2013.01); *H04B 1/109* (2013.01); *H04B 2001/485* (2013.01)

(58) Field of Classification Search
CPC ........ H04B 1/04; H04B 1/0475; H04B 1/109; H04B 1/16; H04B 1/3833; H04B 1/40;
(Continued)

(56) References Cited

U.S. PATENT DOCUMENTS 5,923,647 A  7/1999 Dolman et al.
6,272,327 B1  8/2001 Kurchuk et al.
(Continued)

FOREIGN PATENT DOCUMENTS

CN           100382468 C    4/2008
WO      WO-2012079187 A1    6/2012

OTHER PUBLICATIONS

International Search Report PCT/ISA/210 for International Application No. PCT/EP2018/071875 dated Dec. 7, 2018.

*Primary Examiner* — Quochien B Vuong
(74) *Attorney, Agent, or Firm* — Harness, Dickey & Pierce, P.L.C.

(57) ABSTRACT

The apparatus includes a first transistor having a gate/base terminal to receive a first drive control signal used for controlling a driver stage of the transceiver and a drain/collector terminal coupled to a control terminal of a switch of the transceiver. The first transistor is switched on when the first drive control signal is at a first level that enables the driver stage to amplify a first RF signal. When the first transistor is switched on, the drain/collector terminal of the first transistor outputs to a control terminal of the switch a switch control signal at a second level that enables the switch to provide a portion of the RF signal reflected by the antenna to the load.

15 Claims, 6 Drawing Sheets

(58) Field of Classification Search
CPC ... H04B 1/44; H04B 1/48; H04B 1/52; H04B 1/54; H04B 1/401; H04B 1/525; H04B 1/1027; H04B 10/071; H04B 10/40; H04B 10/2507; H04B 15/00; H04B 17/103; H04W 88/02; H03F 1/52; H03F 1/523; H03F 2200/451; H03F 2200/294

See application file for complete search history.

(56) References Cited

U.S. PATENT DOCUMENTS

| | | | |
|---|---|---|---|
| 7,373,115 B2* | 5/2008 | Monroe | H04B 1/48 |
| | | | 455/83 |
| 8,099,061 B2* | 1/2012 | Huynh | H04B 1/54 |
| | | | 455/78 |
| 8,330,547 B2 | 12/2012 | Godbole | |
| 8,843,082 B2* | 9/2014 | Dufrene | H04B 1/525 |
| | | | 455/77 |
| 9,002,296 B2* | 4/2015 | Yoon | H04B 1/44 |
| | | | 455/82 |
| 9,025,646 B2 | 5/2015 | Aparin | |
| 9,124,354 B2 | 9/2015 | Ganti et al. | |
| 9,853,802 B2 | 12/2017 | Li et al. | |
| 10,425,120 B2 | 9/2019 | Haine et al. | |
| 10,848,187 B2* | 11/2020 | Thompson | H04B 1/525 |
| 2017/0019141 A1 | 1/2017 | Campbell | |

\* cited by examiner

LOW NOISE AMPLIFIER PROTECTION

CROSS-REFERENCE TO RELATED APPLICATIONS

This application is a continuation of U.S. application Ser. No. 16/637,317, filed Feb. 7, 2020 which is a national phase under 35 U.S.C. § 371 of PCT International Application No. PCT/EP2018/071875 which has an International filing date of Aug. 13, 2018, which claims priority to Chinese Application No. 201710697322.X, filed Aug. 15, 2017, the entire contents of each of which are hereby incorporated by reference.

TECHNOLOGY

Embodiments of the present disclosure generally relate to electrical circuitry, and more specifically to electrical circuitry for protecting a low noise amplifier in a transceiver.

BACKGROUND

Transceivers are used in wireless devices of a communication system to transmit and receive signal for two-way communication. For signal transmission, a transceiver may modulate a radio frequency (RF) signal with data to obtain a modulated RF signal, amplify and filter the modulated RF signal to obtain an amplified RF signal having a proper output power level, and transmit the amplified RF signal via one or more antennas to other wireless device(s). For signal reception, the transceiver may obtain an RF signal via one or more antenna(s) and may amplify, filter and process the received RF signal to recover data in the received RF signal. Thus, front-end architectures of transceivers may employ components such as pre-drivers, drivers, and low noise amplifiers (LNAs) to process the received and transmitted RF signals.

Typically, the wireless device may operate in a frequency division duplex (FDD) mode or in a time division duplex system (TDD) mode. The transceiver supporting the signal transmission and reception for the wireless device may thus be classified into an FDD transceiver or a TDD transceiver. A TDD transceiver may be switched into a transmission mode at a first time or a reception mode at a second time. An LNA included in the TDD transceiver is used to process the received RF signal, which may be easily burnt or damaged by high power input. Since the TDD transceiver may be operated in either the transmission mode or the reception mode and the RF signal to be transmitted in the transmission mode is usually amplified to a high power level, the LNA needs to be protected from being damaged by error high power input.

SUMMARY

Example implementations of the present disclosure propose a solution for protecting a low noise amplifier (LNA) in a transceiver.

In a first aspect, example implementations of the present disclosure provide an apparatus used with a transceiver. The transceiver includes an antenna operable to transmit a first radio frequency (RF) signal at a first time and to receive a second RF signal at a second time, a driver stage operable to amplify, based on a first drive control signal, the first RF signal, an LNA operable to amplify the second RF signal, a circulator operable to provide the first RF signal to the antenna at the first time and receive the second RF signal from the antenna at the second time, a load, and a switch having an input terminal connected to the circulator, a control terminal to receive a switch control signal, a first output terminal connected to the LNA, and a second output terminal connected to the load, the switch being operable to provide to the load a portion of the first RF signal reflected by the antenna, based on the switch control signal, when the transceiver is in a transmission mode, and to provide to the LNA the second RF signal, based on the switch control signal, when the transceiver is in a reception mode. The apparatus includes a first transistor having a gate/base terminal to receive the first drive control signal and a drain/collector terminal coupled to the control terminal of the switch. The first transistor is switched on when the first drive control signal is at a first level that enables the driver stage to amplify the first RF signal. When the first transistor is switched on, the drain/collector terminal of the first transistor outputs to the control terminal of the switch the switch control signal at a second level that enables the switch to provide the reflected portion to the load.

In a second aspect, example implementations of the present disclosure provide a method for the apparatus according to the first aspect. The method includes receiving, by a gate/base terminal of a first transistor of the apparatus, a first drive control signal for controlling a driver stage of a transceiver to amplify a first RF signal to be transmitted. The method also includes, in response to the first drive control signal being at a first level that enables the driver stage to amplify the first RF signal, switching on the first transistor of the apparatus; and in response to the first transistor being switched on. The method further includes providing, by a drain/collector terminal of the first transistor of the apparatus, a switch control signal at a second level to a control terminal of a switch of the transceiver. The switch control signal enables the switch of the transceiver to provide a portion of the first RF signal reflected by an antenna of the transceiver to a load of the transceiver other than to an LNA of the transceiver.

Other advantages achieved by example implementations of the present disclosure will become apparent through the following descriptions.

DESCRIPTION OF DRAWINGS

Through the following detailed description with reference to the accompanying drawings, the above and other objectives, features and advantages of example implementations of the present disclosure will become more comprehensible. In the drawings, several example implementations of the present disclosure will be illustrated in an example and non-limiting manner, in which.

Throughout the drawings, the same or corresponding reference symbols refer to the same or corresponding parts.

DESCRIPTION OF EXAMPLE EMBODIMENTS

Principles of example implementations of the present disclosure will now be described with reference to various example implementations illustrated in the drawings. It should be appreciated that depiction of those implementations is only to enable those skilled in the art to better understand and further implement example implementations of the present disclosure and is not intended for limiting the scope of the present disclosure in any manner.

In the following description and claims, unless defined otherwise, all technical and scientific terms used herein have the same meanings as commonly understood by one of ordinary skilled in the art to which this disclosure belongs.

As used herein, the term "network device" or "base station" (BS) refers to a device which is capable of providing or hosting a cell or coverage where terminal devices can communicate. Examples of a network device include, but are not limited to, a Node B (NodeB or NB), an Evolved NodeB (eNodeB or eNB), a Remote Radio Unit (RRU), a radio head (RH), a remote radio head (RRH), a low power node such as a femto node, a pico node, and the like.

As used herein, the term "terminal device" refers to any device having wireless or wired communication capabilities. Examples of the terminal device include, but are not limited to, user equipment (UE), personal computers, desktops, mobile phones, cellular phones, smart phones, personal digital assistants (PDAs), portable computers, image capture devices such as digital cameras, gaming devices, music storage and playback appliances, or Internet appliances enabling wireless or wired Internet access and browsing and the like. In some examples, the terminal device includes an Internet of Things (IoT) device which is the network of physical objects or "things" embedded with electronics, software, sensors, and connectivity to enable objects to exchange data with the manufacturer, operator and/or other connected devices.

As used herein, the singular forms "a," "an," and "the" are intended to include the plural forms as well, unless the context clearly indicates otherwise. The term "includes" and its variants are to be read as open terms that mean "includes, but is not limited to." The term "based on" is to be read as "based at least in part on." The term "one embodiment" and "an embodiment" are to be read as "at least one embodiment." The term "another embodiment" is to be read as "at least one other embodiment." The terms "first," "second," and the like may refer to different or same objects. Other definitions, explicit and implicit, may be included below.

In some examples, values, procedures, or apparatus are referred to as "best," "lowest," "highest," "minimum," "maximum," or the like. It will be appreciated that such descriptions are intended to indicate that a selection among many used functional alternatives can be made, and such selections need not be better, smaller, higher, or otherwise preferable to other selections.

Embodiments of the present disclosure relate to low noise amplifier (LNA) protection for a transceiver, especially for a time division duplex (TDD) transceiver. Some example structures and work principles of a TDD transceiver is first introduced below.

Figure 1:
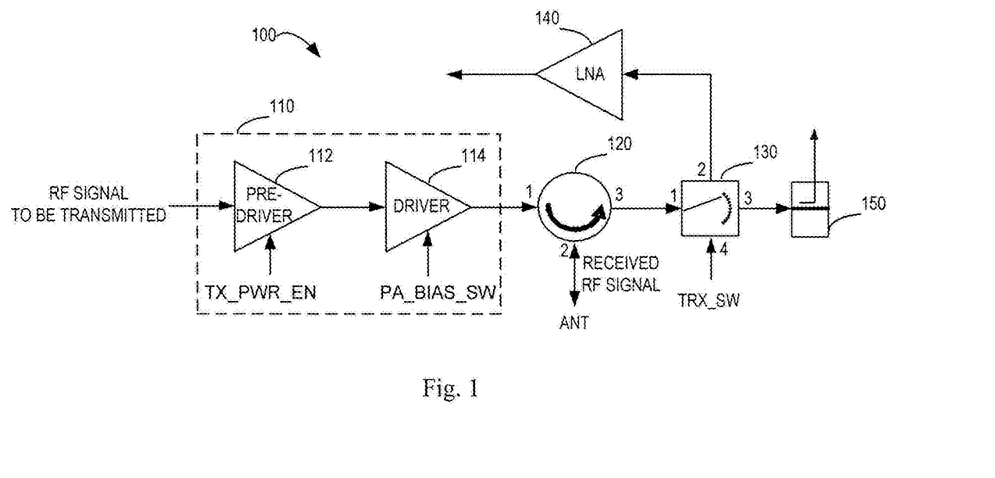
FIG. 1 is a block diagram of a radio frequency (RF) front end of a typical transceiver.

A typical transceiver (TRX) 100 is shown in FIG. 1, where a radio frequency (RF) front end of the transceiver is illustrated in detail. As shown, the transceiver 100 includes a driver stage 110 to amplify an RF signal to be transmitted (which is referred to as a first RF signal hereinafter for the purpose of discussion). The first RF signal may be provided to the driver stage 110 by other components (not shown) of the transceiver 100, such as a digital-analog converter (DAC) and a modulator. The driver stage 110 may include a pre-driver 112 to amplify the first RF signal to a first power level. The first RF signal amplified by the pre-driver 112 is input to a driver 114 in the driver stage 110 to further amplify the first RF signal. The driver 114 is operable to drive the first RF signal to a second power level that is higher than the first power level. For example, the first power level may be less than 15 dBm while the second power level may be much higher than 15 dBm.

The transceiver 100 also includes a circulator 120, which is a common component used by both a transmission (TX) path and a reception (RX) path of the transceiver 100. The circulator 120 has a first terminal (terminal 1) connected to the driver stage 110, a second terminal (terminal 2) connected to a switch 130, and a third terminal (terminal 3) connected to an antenna (ANT) of the transceiver 100. When the transceiver 100 operates in a TX mode, the circulator 120 is operable to transmit the RF signal received at the first terminal from the driver 114 to the connected antenna via the third terminal. The antenna can transmit the RF signal to another wireless device. When the transceiver 100 operates in an RX mode, the circulator 120 is operable to receive an RF signal from the antenna via the second terminal. The received RF signal may be referred to as a second RF signal hereinafter for the purpose of discussion.

The transceiver 100 further includes an LNA 140 to process the received second RF signal. The switch 130 has different terminals to connect to different components of the transceiver 100. In particular, the switch 130 has a first terminal (an input terminal or terminal 1) connected to the circulator 120, a second terminal (an output terminal, or terminal 2) connected to the LNA 140, a third terminal (another output terminal, or terminal 3) connected to a load 150, and a fourth terminal (a control terminal, or terminal 4) to receive a switch control signal. Depending on the received switch control signal, the switch 130 selectively connects the circulator 120 to the LNA 140 or the load 150. When the transceiver 100 is in the RX mode, the switch 130 may be controlled to switch to the LNA 140 so as to provide the received second RF signal from the circulator 120 to the LNA 140. When the transceiver 100 is in the TX mode, the switch 130 may be controlled to switch to the load 150. The load 150 may be a high power load used to absorb an injected RF energy of the first RF signal. The injected RF energy may be a portion of the first RF signal reflected by the antenna during the TX mode. With the use of the switch 130 and the load 150, the reflected portion may be prevented from being provided to the LNA 140.

As a TDD transceiver, the transceiver 100 may operate in the TX mode at a first time and in an RX mode at a second different time. Thus, some components of the transceiver 100 may be enabled or disabled according to corresponding control signals. During normal runtime, the driver stage 110 is enabled when the transceiver 100 operates in the TX mode and is disabled when the transceiver 100 operates in the RX mode. Specifically, the pre-driver 112 is controlled by a drive control signal (denoted as TX_PWR_EN, also referred to as a first drive control signal) received from a control terminal of the pre-driver 112. In some implementations, the pre-driver 112 is enabled to process the RF signal when the drive control signal TX_PWR_EN is at a logic high level (for example, with a high voltage level), and is disabled when the drive control signal TX_PWR_EN is at an opposite logic level (for example, at a logic low level or with a low voltage level). When the pre-driver 112 is disabled, there is no input RF signal to the driver 114. In some other implementations, depending on the actual requirements and designs, the pre-driver 112 may also be enabled by a drive control signal TX_PWR_EN at a logic low level and disabled by a drive control signal TX_PWR_EN at a logic high level.

The driver 114 is controlled by another drive control signal (denoted as PA_BIAS_SW, also referred to as a second drive control signal) received from a control terminal of the driver 114. In some implementations, the driver 114 may be enabled to process the RF signal input from the pre-driver 112 when the drive control signal PA_BIAS_SW is at a logic high level and is disabled when the drive control signal PA_BIAS_SW is at an opposite logic level. Of course, in other implementations, the driver 114 may be enabled by a drive control signal PA_BIAS_SW at a logic low level and disabled by a drive control signal PA_BIAS_SW at a logic high level depending on the actual requirements and designs. In some cases, if the power level of the RF signal from the pre-driver 112 is larger enough (for example, greater than 25 dBm), the driver 114 may be turned on regardless of the level of the drive control signal PA_BIAS_SW.

As mentioned above, the switch 130 is also controlled by a switch control signal (denoted as TRX_SW) so that the switch 130 can be switched to the LNA 140 or the load 150. The switch control signal TRX_SW may be configured so that the received RF signal from the antenna may be provided by the switch 130 to the LNA 140 when the transceiver 100 is in the RX mode and a portion of a to-be-transmitted RF signal reflected by the antenna may be by the switch 130 to the load 150 when the transceiver 100 is in the TX mode. In some examples, the switch 130 may switch to the load 150 when the switch control signal TRX_SW is at a logic high level and to the LNA 140 when the switch control signal TRX_SW is at a logic low level. In other examples, a switch control signal TRX_SW at a logic low level may control the switch 130 to switch to the LNA 140 and a switch control signal TRX_SW at a logic high level may control the switch 130 to switch to the load 150.

In sum, in the TX mode, the drive control signals TX_PWR_EN and PA_BIAS_SW may be generated to certain levels that enable the pre-driver 112 and the driver 114, respectively, while the switch control signal TRX_SW is generated as a level that enables the switch 130 to provide the reflected portion of the first RF signal to the load 150. In the RX mode, the drive control signals TX_PWR_EN and PA_BIAS_SW may be generated to levels that disable the pre-driver 112 and the driver 114, respectively, while the switch control signal TRX_SW is generated as a level that enables the switch 130 to provide the received second signal to the LNA 140. It can be seen that the drive control signals TX_PWR_EN and PA_BIAS_SW as well as the switch control signal TRX_SW are important for normal operations of the transceiver 100.

Figure 2:
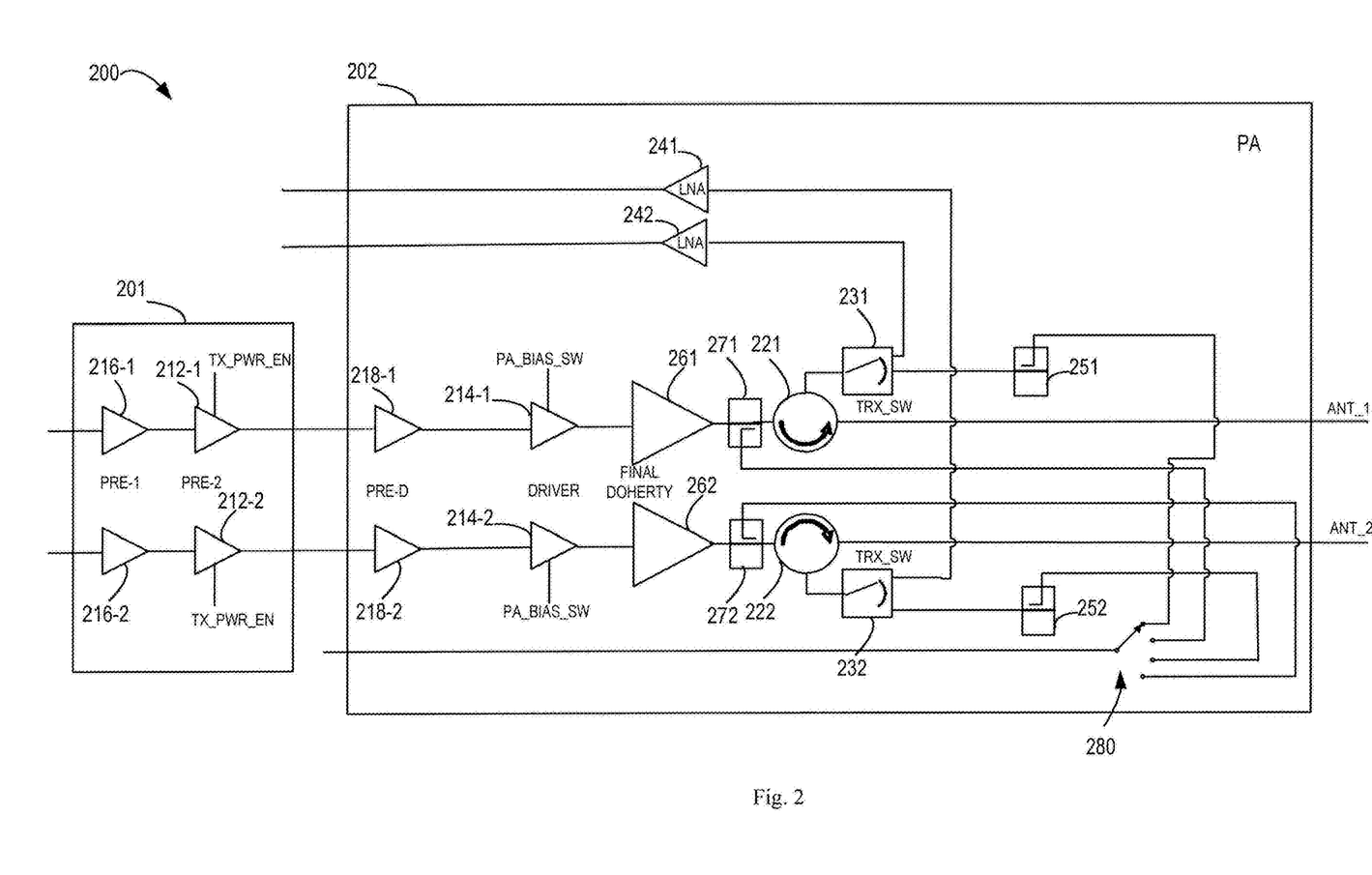
FIG. 2 is a block diagram of an example RF front end in a typical transceiver.

FIG. 2 shows another example of a transceiver 200. The transceiver 200 may be considered as a specific example of the transceiver 100. In this example, the transceiver 200 includes two antennas ANT_1 and ANT_2 and thus has corresponding TX and RX processing paths for processing RF signals to be transmitted and/or received by each of the antennas ANT_1 and ANT_2.

For the antenna ANT_1, as shown, the transceiver 200 includes a pre-driver stage 201 and a power amplification (PA) stage 202. The pre-driver stage 201 includes two pre-drivers (Pre-1 and Pre-2) 216-1 and 212-1 for amplifying a first RF signal to be transmitted via the antenna ANT_1. The amplified first RF signal is provided from the pre-driver 212-1 as an input to the PA stage 202. In the PA stage 202, a pre-driver (Pre-d) 218-1 further amplifies the first RF signal and provides the amplified first RF signal to a driver 214-1 to amplify the first RF signal to a power level higher than the pre-drivers. Before transmitting to a circulator 221, the first RF signal is further processed in the final driver 261, which may be a final Doherty driver. The load 271 is set between the driver 261 and the circulator 221 for protection. The circulator 221 functions similarly as the circulator 120 of FIG. 1 to transmit the first RF signal to the antenna ANT_1 and receive a second RF signal from the antenna ANT_1. A switch 231 functions similarly as the switch 130 of FIG. 1 to selectively connect the circulator 221 to a high power load 251 or to an LNA 241, so that the reflected RF energy from the circulator 221 is provided to the load 251 while the received RF signal from the circulator 221 is provided to the LNA 241.

For the antenna ANT_2, there are similar components, including pre-drivers 216-2 and 212-2 in the pre-driver stage 201, a pre-driver 218-2, a driver 214-2, a final driver 262, a protection load 272, a circulator 222, a switch 232, an LNA 242, and a high power load 252. These components operate in a similar way as the corresponding components used for the antenna ANT_1 to perform signal transmission and reception of the antenna ANT_2. A switch assembly 280 is included in the transceiver 200 to selectively transmit the energy or signal portion of the loads 271, 272, 251, and 252 to a signal ground or to other components for further processing.

In some cases, all the pre-drivers and drivers of the transceiver 200 may be considered as a driver stage for signal amplification in the TX mode of the transceiver 200. Some of the pre-drivers and/or drivers are controlled by certain drive control signals for proper operations of the transceiver 200. In the example of FIG. 2, a first drive control signal TX_PWR_EN is used to enable the pre-drivers 212-1 and 212-2 in the TX mode and disable the two pre-drivers in the RX mode, a second drive control signal PA_BIAS_SW is used to enable the drivers 214-1 and 214-2 in the TX mode and disable the two drivers in the RX mode. A switch control signal TRX_SW is provided to the switches 231 and 232 through control terminals of the switches, so that the switches 231 and 232 may be controlled to connect the circulators 231 and 232 to the loads 251 and 252, respectively, to inject the reflected energy from the antenna to the loads. The switches 231 and 232 may also be controlled by the switch control signal TRX_SW to connect the circulators 231 and 232 to the LNAs 241 and 242 such that the received RF signal form the antenna may be processed. In some implementations, the outputs of the LNAs 241 and 242 may be provided to other components (not shown) of the transceiver to further processing.

It would be appreciated that the structure of the transceiver 100 or 200 in FIG. 1 or 2 is illustrated merely for the purpose of illustration. In some other examples, more, less, or different components of the transceiver other than those illustrated in FIG. 1 or 2 may also possible depending on actual requirements or implementations. For example, the transceiver 200 may include more or less pre-drivers or drivers for amplification of RF signals to be transmitted. As another example, before being transmitted by an antenna to another device or being providing by the antenna to the corresponding circulator, the RF signal may be filtered by a filter connected between the antenna and the circulator. Depending on the antennas employed in the transceiver, the structure of the transceiver may also be varied. Thus, the scope of the present disclosure is not limited by the specific structure of the transceiver.

In conventional solutions, the control signals for a transceiver are generated based on program code, for example, through code in an Application Specific Integrated Circuit (ASIC) or a Field Programmable Gate Array, or through software controlling of a Digital Front End (DFE). In these cases, there may be software bugs or logic errors in generation of those control signals so that the logic levels of the control signals may be improper for the mode of operations in the transceiver. In addition, since the reference clock used in the FPGA or ASIC is recovered via a fiber from a remote device, if the fiber is not stable due to the long distance transmission or if the fiber is suddenly disconnected by improper operation, timing errors may happen in the FPGA or ASIC, which may also lead to improper control signals.

The tolerant input power level of an LNA is usually lower than the level of the amplified RF signal to be transmitted. For example, a typical maximum input power level of the LNA may be 28 dBm or less, while the maximum output power level after the driver stage is greater than 50 dBm. Generally, the output power level of the RF signal output from the pre-driver (for example, less than 15 dBm) will not damage the LNA even if feedthrough happens in the pre-driver due to the error drive control signal. However, the output power level of the RF signal output from the driver in the driver stage (50 dBm) may probably brunt the LNA. In such case, during the TX mode, if the switch is controlled by an error switch control signal TRX_SW to provide from the circulator to the LNA the reflected RF energy amplified after the driver, the LNA may be damaged or even burnt.

The LNA damage may also happen in the RX mode due to the low isolation index between the output of the LNA and the input of the driver. If the driver is turned on by the corresponding drive control signal PA_BIAS_SW at the RX mode, due to poor low isolation, driver self-excitation happens. Thus, if the drive control signal PA_BIAS_SW is at an error level that enables the driver instead of disabling the driver, the received RF signal output from the LNA may be sensed by the driver to process as an RF signal to be transmitted. The RF signal output from the driver may be provided by the circulator back to the antenna, and the portion of the RF signal reflected by the antenna may then be switched to the LNA if the TRX_SW is at a level that connects the circulator to the LNA (which will usually be the case because the transceiver is in the RX mode). The LNA may also be probably damaged or burnt because of the reflected RF energy.

In order to protect the LNA in a transceiver, according to implementations of the present disclosure, there is provided an apparatus used with a transceiver for the purpose of LNA protection. The apparatus may be implemented by a hardware circuit and configured to prevent the RF energy reflected by an antenna from being providing by a switch of the transceiver to the LNA of the transceiver. Example implementations of the apparatus will be discussed below with reference to the accompanying drawings.

Figure 3:
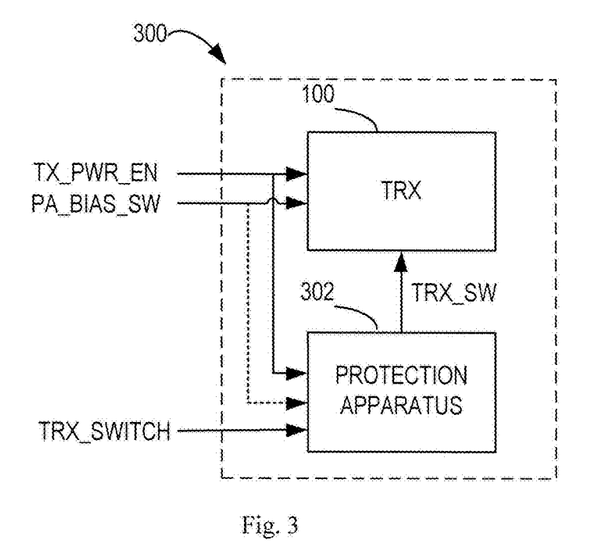
FIG. 3 is a block diagram of a system including a transceiver and a protection apparatus in accordance with implementations of the present disclosure.

FIG. 3 shows a system 300 including the transceiver (TRX) 100 of FIG. 1 and an apparatus 302 used with the transceiver 100 according to implementations of the present disclosure. The components included in the transceiver 100 may operate in a similar way as described with reference to FIG. 1. The system 300 may be implemented in a wireless device for two-way communication. Examples of the wireless device include, but are not limited to a network device, a terminal device, and/or any other communication devices. Although shown as being separated from the transceiver 100, the apparatus 302 may also be integrated within the transceiver 100.

The apparatus 302 is a protection apparatus used for protecting one or more LNAs included in the transceiver 100. In implementations of the present disclosure, the apparatus 302 is configured to generate a switch control signal (denoted as TRX_SW) to control the switch 130 in the transceiver 100 based on the drive and switch control signals generated by other devices that are intended to be used for controlling the driver stage 110 and/or the switch 130 of the transceiver 100. The switch control signal TRX_SW generated by the apparatus 302 is provided to the switch 130 of the transceiver 100 to control the switch 130. The original drive control signals may also be provided to the driver stage 110 of the transceiver for controlling.

The device that provides those control signals to the transceiver 100 may include a FPGA, an ASIC, a DFE, and/or other devices. The control signals generated by the FPGA/ASIC/DFE to control the pre-driver and driver in the driver stage 110 are denoted as TX_PWR_EN and PA_BIAS_SW, respectively. To differentiate from the output switch control signal TRX_SW that is actually used to control the switch 130, the switch control signal generated by the FPGA/ASIC/DFE may be denoted as TRX_SWITCH, which is intended for controlling the switch 130 of the transceiver 100 but is prevented from being provided to the switch 130 in implementations of the present disclosure.

In implementations of the present disclosure, the apparatus 302 is configured to generate the switch control signal TRX_SW at a level that enables the switch 130 to provide a portion of an RF signal reflected by the antenna of the transceiver 100 to the load 150, if the drive control signal is generated at a level that enables the driver stage to amplify the RF signal to be transmitted (for example, if TX_PWR_EN or PA_BIAS_SW is at a level that enables the pre-driver 112 or the driver 114). The RF signal with a portion reflected by the antenna may be an RF signal to be transmitted by the transceiver 100, or an RF signal received by the transceiver 100 but sensed by the driver stage 110 because of self-excitation happened in the PA stage of the transceiver 100. With the switch control signal TRX_SW from the apparatus 302, although the pre-driver 112 or the driver 114 is turned on, it is possible to guarantee the safety of the LNA 140 because the switch control signal TRX_SW is configured by the apparatus 302 to be at a level that control the switch 130 to provide a signal to the load 150 other than the LNA 140.

If the drive control signal is generated at a level that disables the driver stage (for example, if both TX_PWR_EN and PA_BIAS_SW are at levels that disable the pre-driver 112 and the driver 114), the apparatus 302 may be configured to generate the switch control signal TRX_SW at a same level as the switch control signal TRX_SWITCH received from the FPGA/ASIC/DFE. In this case, the switch control signal TRX_SWITCH may be generated at any level that enables to the switch 130 to switch to the load 150 or the LNA 140. Even if the switch 130 switches to the LNA 140 due to an error switch control signal TRX_SWITCH, the LNA 140 may not be damaged because the driver stage 110 is disabled at this time.

In some implementations, only the drive control signal TX_PWR_EN and the switch control signal TRX_SWITCH generated by the FPGA/ASIC/DFE are used as inputs to the apparatus 302 to generate the switch control signal TRX_SW for the switch 130. In these implementations, the drive control signal PA_BIAS_SW may be omitted from being an input to the apparatus 302.

The generation of the switch control signal TRX_SW in the apparatus 302 may be implemented by one or more transistors. The transistors may be selected as NMOS field effect transistors, PMOS field effect transistors, and/or other types of transistors such as bipolar junction transistor, triode, and the like. Some implementations based on NMOS transistor(s) and PMOS transistor(s) will be described below in detail. However, it would be appreciated that in other implementations, other types of transistors may be employed to perform the similar functions according to the implementations of the present disclosure.

Figure 4A:
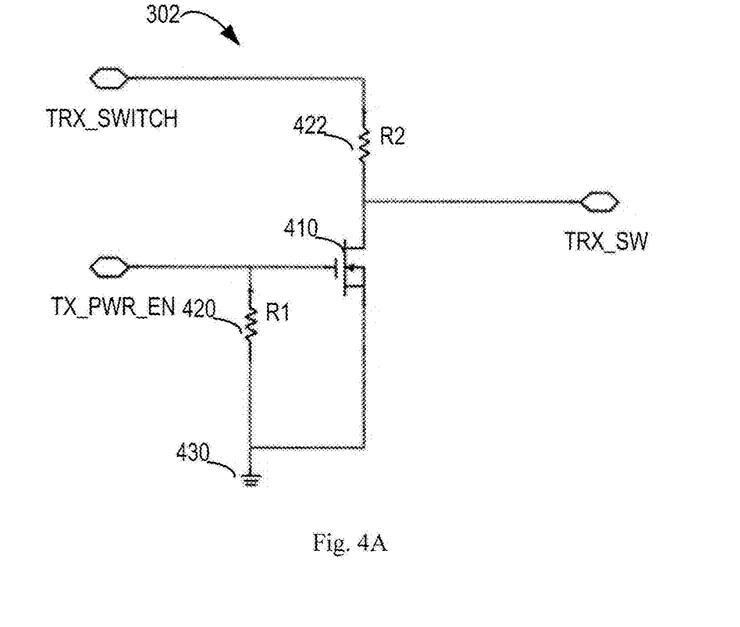
FIG. 4A is an schematic diagram of an example protection apparatus implemented by an n-channel metal oxide semiconductor (NMOS) transistor in accordance with an implementation of the present disclosure.

FIG. 4A shows an example of the apparatus 302 including a NMOS transistor 410. In the example of FIG. 4A, the transistor 410 has a gate terminal to receive a drive control signal TX_PWR_EN and a drain terminal coupled to the control terminal of the switch to output the switch control signal TRX_SW to the switch. The drive control signal TX_PWR_EN may be received from other devices such as the FPGA/ASIC/DEF that is employed to generate the control signal for the transceiver 100. The transistor 410 also has a source terminal connected to a signal ground 430. The gate terminal of the transistor 410 may be connected to a terminal of a resistor (R1) 420. The other terminal of the resistor 420 is connected to the signal ground 430. The drain terminal of the transistor 410 also receives the switch control signal TRX_SWITCH that is generated by the FPGA/ASIC/DEF and is intended for controlling the switch 130 of the transceiver 100. The drain terminal of the transistor 410 may be connected to a resistor (R2) 422. The resistor 422 has a terminal to receive the switch control signal TRX_SWITCH and another terminal connected to the drain terminal of the transistor 410.

It is supposed that the pre-driver 112 is turned on by a drive control signal TX_PWR_EN at a relatively high voltage level and the switch 130 switches to the LNA 140 by a switch control signal TRX_SW at a relatively high voltage level, and it is also supposed that the high voltage level is a logic high level (denoted as "1"), while the low voltage level is a logic low level (denoted as "0"). According to the configuration of the apparatus 302 as described above, a truth table to be implemented in the apparatus 302 is provided as Table 1 as follows:

TABLE 1

| TX_PWR_EN (from FPGA/ASIC/DFE) | TRX_SWITCH (from FPGA/ASIC/DFE) | TRX_SW (to the switch) |
|---|---|---|
| 0 | TRX_SWITCH | TRX_SWITCH |
| 1 | TRX_SWITCH | 0 |

Specifically, if the drive control signal TX_PWR_EN is at a logic high level ("1"), the transistor 410 is switched on. When the transistor 410 is switched on, the drain terminal of the transistor 410 is connected to the signal ground 430 and the switch control signal TRX_SW output at the drain terminal of the transistor 410 is at a logic low level ("0"), which may enable the switch 130 to provide the reflected portion of an RF signal to the load 150 because the switch 130 is controlled by the switch control signal TRX_SW at the logic low level to connect the circulator 130 to the load 150.

If the drive control signal TX_PWR_EN is at a logic low level ("0") that disables the pre-driver 112, the transistor 410 is switched off. In this case, the switch control signal TRX_SW output at the drain terminal of the transistor 410 is at a same level of the received switch control signal TRX_SWITCH. Thus, the switch 130 is actually controlled by the same switch control signal TRX_SWITCH received from the FPGA/ASIC/DFE.

Figure 4B:
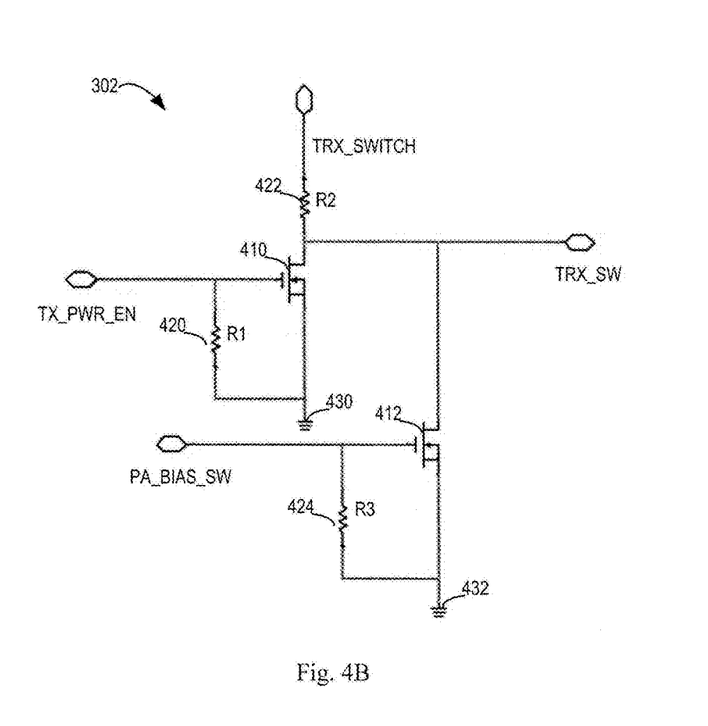
FIG. 4B is a schematic diagram of another example protection apparatus implemented by NMOS transistors in accordance with an implementation of the present disclosure.

In some other implementations, both the drive control signals TX_PWR_EN and PA_BIAS_SW are input to the apparatus 302 to generate the switch control signal TRX_SW. In these implementations, a further transistor may be included in the apparatus 302. FIG. 4B illustrates an example of such an apparatus 302. As shown in FIG. 4B, a further NMOS transistor 412 is included. The arrangement of the transistor 412 is similar to that of the transistor 410. The gate terminal of the transistor 412 is arranged to receive the drive control signal PA_BIAS_SW, the drain terminal of the transistor 412 is coupled to the drain terminal of the transistor 410 and thus to the control terminal of the switch 130. The gate terminal of the transistor 412 may be connected to a terminal of a resistor (R3) 424. The other terminal of the resistor 424 is connected to a signal ground 432.

According to the configuration of the apparatus 302 as described above, a truth table to be implemented in the apparatus 302 is provided as Table 2 as follows:

TABLE 2

| TX_PWR_EN (from FPGA/ASIC/DFE) | PA_BIAS_SW (from FPGA/ASIC/DFE) | TRX_SWITCH (from FPGA/ASIC/DFE) | TRX_SW (to the switch) |
|---|---|---|---|
| 0 | 0 | TRX_SWITCH | TRX_SWITCH |
| 0 | 1 | TRX_SWITCH | 0 |
| 1 | 0 | TRX_SWITCH | 0 |
| 1 | 1 | TRX_SWITCH | 0 |

If the drive control signal PA_BIAS_SW is at a logic high level ("1") that enables the driver 114 of the transceiver 100, the transistor 412 is switched on, and thus the drain terminal of the transistor 412 is connected to the signal ground 432. Thus, the switch control signal TRX_SW output at the drain terminal of the transistor 412 is at a logic low level ("0"), which will control the switch 130 to switch to the load 150 other than to the LNA 140. If both the drive control signals PA_BIAS_SW and TX_PWR_EN are at a logic low level ("0") that disables the pre-driver 112 and the driver 114, the transistors 410 and 412 are switched off. In this case, the control signal TRX_SW output at the drain terminal of the transistor 410 is at a same level of the received switch control signal TRX_SWITCH.

Figure 5A:
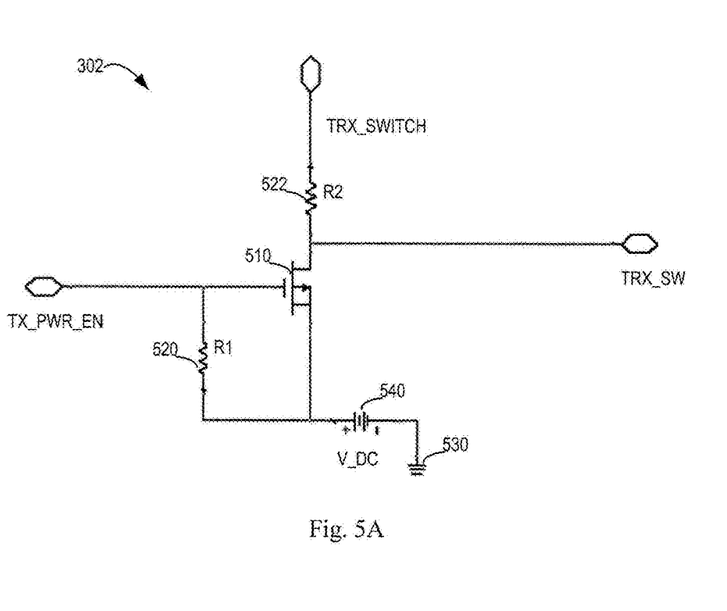
FIG. 5A is a schematic diagram of an example protection apparatus implemented by a p-channel metal oxide semiconductor (PMOS) transistor in accordance with an implementation of the present disclosure.
Figure 5B:
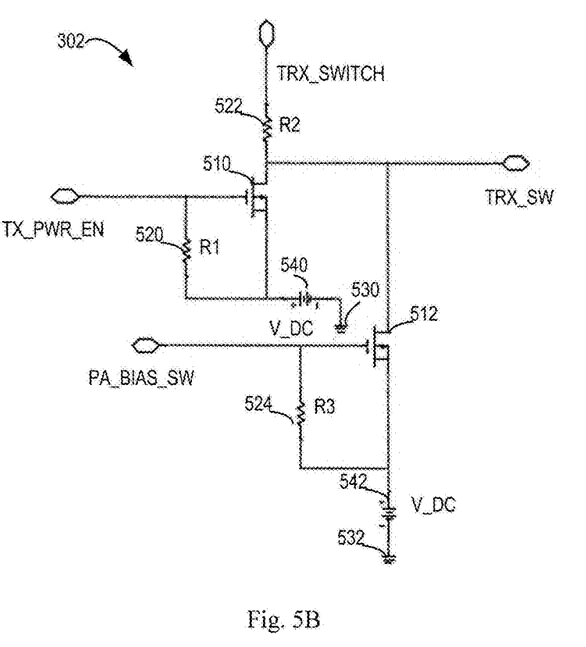
FIG. 5B is a schematic diagram of another example protection apparatus implemented by PMOS transistors in accordance with an implementation of the present disclosure.

In the implementations of FIGS. 4A and 4B, the drive control signals TX_PWR_EN and/or PA_BIAS_SW are enabled by a high voltage level and disabled by a low voltage level, and thus the NMOS transistors may be applicable. In some other implementations, the drive control signals TX_PWR_EN and/or PA_BIAS_SW may be enabled by a low voltage level and disabled by a high voltage level. In these implementations, PMOS transistors that are switched on by low voltage levels may be selected to implement the apparatus 302. FIGS. 5A and 5B show some example implementations of the apparatus 302 including PMOS transistors.

The example of FIG. 5A is similar to that shown in FIG. 4A, where only one drive control signal TX_PWR_EN is input to the apparatus 302 as well as the switch control signal TRX_SWITCH. As shown, the apparatus 302 includes a PMOS transistor 510. The gate and drain terminals of the transistors 510 are arranged in a similar manner as those of the NMOS transistor 410, and the source terminal of the transistor 510 is connected to a voltage source (V_DC) 540, which is connected to a signal ground 530. The gate terminal of the transistor 510 may be connected to a terminal of a resistor (R1) 520. The other terminal of the resistor 520 is connected to the voltage source 540. The drain terminal of the transistor 510 may be connected to a resistor (R2) 522. The resistor 522 has a terminal to receive the switch control signal TRX_SWITCH and another terminal connected to the drain terminal of the transistor 510.

Since the pre-driver 112 is enabled by a drive control signal TX_PWR_EN at a low voltage level (corresponding to a logic low level "0"), the truth Table 1 may be modified as below:

TABLE 3

| TX_PWR_EN (from FPGA/ ASIC/DFE) | TRX_SWITCH (from FPGA/ ASIC/DFE) | TRX_SW (to the switch) |
| --- | --- | --- |
| 1 | TRX_SWITCH | TRX_SWITCH |
| 0 | TRX_SWITCH | 1 |

In Table 3, it is supposed that the switch 130 of the transceiver 100 is controlled to switch to the load 150 by a switch control signal TRX_SW at a logic high level (for example, a high voltage level) and switch to the LNA 140 a switch control signal TRX_SW at a logic low level.

The transistor 510 is switch on or off depending on whether the drive control signal TX_PWR_EN is at a logic low level or a logic high level. If the transistor 510 is switched on, the switch control signal TRX_SW output at the drain terminal of the transistor 510 is at a logic high level that enables the switch 130 to switch to the load 150. If the transistor 510 is switched off, the switch control signal TRX_SW output at the drain terminal of the transistor 510 is at a same logic level to the received switch control signal TRX_SWITCH.

FIG. 5B shows another example of the apparatus 302 including PMOS transistors. The example of the apparatus 302 is similar to that shown in FIG. 4B, where both the drive control signals TX_PWR_EN and PA_BIAS_SW are input to the apparatus 302 as well as the switch control signal TRX_SWITCH. As shown, in addition to the transistor 510, the apparatus 302 further includes a PMOS transistor 512.

The arrangement of the transistor 512 is similar to that of the transistor 510. The gate terminal of the transistor 512 is arranged to receive the drive control signal PA_BIAS_SW, the drain terminal of the transistor 512 is coupled to the drain terminal of the transistor 510 and thus to the control terminal of the switch 130. The gate terminal of the transistor 512 may be connected to a terminal of a resistor (R3) 524. The other terminal of the resistor 524 is connected to a voltage source (V_DC) 542, which has a terminal connected to a signal ground 532.

Since both the pre-driver 112 and the driver 114 are enabled by drive control signals at a low voltage level (corresponding to a logic low level "0"), the truth Table 2 may be modified as below:

TABLE 4

| TX_PWR_EN (from FPGA/ ASIC/DFE) | PA_BIAS_SW (from FPGA/ ASIC/DFE) | TRX_SWITCH (from FPGA/ ASIC/DFE) | TRX_SW (to the switch) |
| --- | --- | --- | --- |
| 1 | 1 | TRX_SWITCH | TRX_SWITCH |
| 0 | 1 | TRX_SWITCH | 1 |
| 1 | 0 | TRX_SWITCH | 1 |
| 0 | 0 | TRX_SWITCH | 1 |

In Table 4, it is supposed that the switch 130 of the transceiver 100 is controlled to switch to the load 150 by a switch control signal TRX_SW at a logic high level (for example, a high voltage level) and switch to the LNA 140 a switch control signal TRX_SW at a logic low level.

The transistor 512 is switch on or off depending on whether the drive control signal PA_BIAS_SW is at a logic low level or a logic high level. If either the transistor 512 or the transistor 510 is switched on or both the transistors 510 and 520 are switched on, the switch control signal TRX_SW output at the drain terminal of the transistor 512 is at a logic high level that enables the switch 130 to switch to the load 150. If both the transistors 510 and 512 are switched off, the switch control signal TRX_SW output at the drain terminal of the transistor 512 is at a same logic level to the received switch control signal TRX_SWITCH.

It would be appreciated that although some implementations of the apparatus 302 based on the NMOS and PMOS transistors are described above, in other implementations, other types of transistors may also be employed to implement the apparatus 302. In some cases where one or more semiconductor triodes are employed, the base, collector, and emitter terminals of a triode may be arranged in a similar manner as the gate, drain, and source terminals of a field effect transistor. In some examples, different types of transistors may be included in the apparatus 302 to receive the respective drive control signals TX_PWR_EN and PA_BIAS_SW. For example, depending on the levels of the drive control signals that enable and disable the pre-driver and drivers, a NMOS transistor may be used to have its gate terminal to receive TX_PWR_EN, and a PMOS transistor may be used to have its gate terminal to receive PA_BIAS_SW. The truth table in such apparatus 302 may be varied from the above Tables 1-4.

Figure 6:
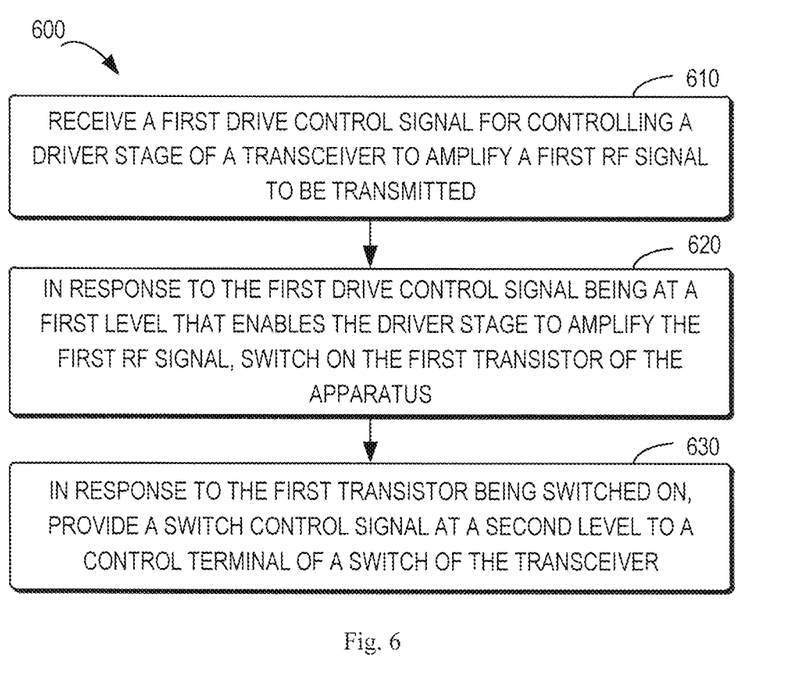
FIG. 6 is a flowchart of a method in accordance with an implementation of the present disclosure.

FIG. 6 shows a flowchart of a method 600 for an apparatus used with a transceiver in accordance with implementations of the present disclosure, which may be implemented, for example, by the apparatus 302. As shown, at 610, a gate/base terminal of a first transistor of the apparatus 302 receives a first drive control signal for controlling a driver stage of a transceiver to amplify a first RF signal to be transmitted. At 620, the first transistor of the apparatus 302 is switched on if the first drive control signal is at a first level that enables the driver stage to amplify the first RF signal. At 630, a drain/collector terminal of the first transistor of the apparatus provides, in response to the first transistor being switched on, a switch control signal at a second level to a control terminal of a switch of the transceiver. The switch control signal enables the switch of the transceiver to provide a portion of the first RF signal reflected by an antenna of the transceiver to a load of the transceiver other than to a low noise amplifier (LNA) of the transceiver.

In some example implementations, the driver stage includes a pre-driver and a driver and the pre-driver may be controlled by the first drive control signal to amplify the first RF signal to a first power level. A gate/base terminal of a second transistor of the apparatus may receive a second drive control signal for controlling the driver to further amplify the first RF signal to a second power level higher than the first power level. In response to the second drive control signal being at the first level that enables the driver to further amplify the first RF signal, the second transistor of the apparatus may be switched on. In these implementations, if the second transistor is switched on, the switch control signal at the second level is provided to the control terminal of the switch.

In some example implementations, the first transistor may be switched off if the first drive control signal is at a third level that disables the driver stage. In these implementations, a further switch control signal is received. The further switch control signal is generated to be intended for controlling the switch of the transceiver and is prevented from being provided to the switch. If the first transistor is switched off, the switch control signal may be provided at a same level as the further switch control signal.

Generally speaking, various example implementations of the present disclosure may be implemented in hardware or special purpose circuits, software, logic or any combination thereof. Some aspects may be implemented in hardware, while other aspects may be implemented in firmware or software which may be executed by a controller, microprocessor or other computing device. While various aspects of the example implementations of the present disclosure are illustrated and described as block diagrams, flowcharts, or using some other pictorial representation, it will be appreciated that the blocks, apparatus, systems, techniques or methods of the present disclosure may be implemented in, as non-limiting examples, hardware, software, firmware, special purpose circuits or logic, general purpose hardware or controller or other computing devices, or some combination thereof.

Additionally, various blocks shown in the flowcharts may be viewed as method steps, and/or as operations that result from operation of computer program code, and/or as a plurality of coupled logic circuit elements constructed to carry out the associated function(s). For example, example implementations of the present disclosure include a computer program product including a computer program tangibly embodied on a machine readable medium, the computer program containing program codes configured to carry out the methods as described above.

In the context of the disclosure, a machine readable medium may be any tangible medium that can contain, or store a program for use by or in connection with an instruction execution system, apparatus, or device. The machine readable medium may be a machine readable signal medium or a machine readable storage medium. A machine readable medium may include, but not limited to, an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing.

Computer program code for carrying out methods of the present disclosure may be written in any combination of one or more programming languages. These computer program codes may be provided to a processor of a general purpose computer, special purpose computer, or other programmable data processing apparatus, such that the program codes, when executed by the processor of the computer or other programmable data processing apparatus, cause the functions/operations specified in the flowcharts and/or block diagrams to be implemented. The program code may execute entirely on a computer, partly on the computer, as a stand-alone software package, partly on the computer and partly on a remote computer or entirely on the remote computer or server. The program code may be distributed on specially-programmed devices which may be generally referred to herein as "modules". Software component portions of the modules may be written in any computer language and may be a portion of a monolithic code base, or may be developed in more discrete code portions, such as is typical in object-oriented computer languages. In addition, the modules may be distributed across a plurality of computer platforms, servers, terminals, mobile devices and the like. A given module may even be implemented such that the described functions are performed by separate processors and/or computing hardware platforms.

While operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure or of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination.

Various modifications, adaptations to the foregoing example implementations of the present disclosure may become apparent to those skilled in the relevant arts in view of the foregoing description, when read in conjunction with the accompanying drawings. Any and all modifications will still fall within the scope of the non-limiting and example implementations of the present disclosure. Furthermore, other implementations of the present disclosure will come to mind to one skilled in the art to which those implementations pertain having the benefit of the teachings presented in the foregoing descriptions and the drawings.

It will be appreciated that the implementations of the present disclosure are not to be limited to the specific implementations disclosed and that modifications and other implementations are intended to be included within the scope of the appended claims. Although specific terms are used herein, they are used in a generic and descriptive sense only and not for purposes of limitation.

What is claimed is:

1. An apparatus used with a transceiver, the transceiver including:
   an antenna configured to transmit a first radio frequency (RF) signal at a first time and to receive a second RF signal at a second time,
   a driver stage configured to amplify, based on a first drive control signal, the first RF signal,
   a low noise amplifier (LNA) configured to amplify the second RF signal,
   a circulator configured to provide the first RF signal to the antenna at the first time and receive the second RF signal from the antenna at the second time,
   a load, and
   a switch having an input terminal connected to the circulator, a control terminal to receive a switch control signal, a first output terminal connected to the LNA, and a second output terminal connected to the load, the switch configured to provide to the load a portion of the first RF signal reflected by the antenna, based on the switch control signal, when the transceiver is in a transmission mode, and to provide to the LNA the second RF signal, based on the switch control signal, when the transceiver is in a reception mode, and
   the apparatus comprising a first transistor having a gate/base terminal to receive the first drive control signal and a drain/collector terminal coupled to the control terminal of the switch, wherein the first transistor is switched on when the first drive control signal is at a first level that enables the driver stage to amplify the first RF signal, and wherein when the first transistor is switched on, the drain/collector terminal of the first transistor outputs the switch control signal to the control terminal of the switch at a second level that enables the switch to provide the reflected portion to the load.

2. The apparatus of claim 1, wherein the driver stage includes a pre-driver configured to amplify, based on the first drive control signal, the first RF signal to a first power level.

3. The apparatus of claim 2, wherein the driver stage further includes a driver configured to further amplify, based on a second drive control signal, the first RF signal to a second power level higher than the first power level, the apparatus further comprising:
   a second transistor having a gate/base terminal to receive the second drive control signal and a drain/collector terminal coupled to the drain/collector terminal of the first transistor and the control terminal of the switch, wherein the second transistor is switched on when the second drive control signal is at the first level that enables the driver to further amplify the first RF signal, and wherein when the second transistor is switched on, the drain/collector terminal of the second transistor outputs the switch control signal at the second level to the control terminal of the switch.

4. The apparatus of claim 1, wherein the drain/collector terminal of the first transistor receives a further switch control signal, and wherein the further switch control signal is generated for controlling the switch and is prevented from being provided to the switch.

5. The apparatus of claim 4, wherein the first transistor is switched off when the first drive control signal is at a third level that disables the driver stage, and wherein when the first transistor is switched off, the drain/collector terminal of the first transistor outputs the switch control signal to the control terminal of the switch at a same level as the further switch control signal.

6. The apparatus of claim 1, wherein the first transistor includes an n-channel metal oxide semiconductor (NMOS) field effect transistor, and wherein a source/emitter terminal of the first transistor is coupled to a signal ground.

7. The apparatus of claim 1, wherein the first transistor includes a p-channel metal oxide semiconductor (PMOS) field effect transistor, and wherein a source/emitter terminal of the first transistor is coupled to a voltage source.

8. The apparatus of claim 1, further comprising:
   a first resistor having a terminal connected to the gate/base terminal of the first transistor.

9. The apparatus of claim 3, further comprising:
   a second resistor having a first terminal to receive the second drive control signal and a second terminal connected to the drain/collector terminal of the first transistor.

10. The apparatus of claim 1, wherein the transceiver includes a time-division duplex (TDD) transceiver.

11. The apparatus of claim 1, wherein the first drive control signal is generated by an Application Specific Integrated Circuit (ASIC), a Field Programmable Gate Array (FPGA), or a Digital Front End (DFE).

12. The apparatus of claim 1, wherein the apparatus is included in a network device or a terminal device.

13. A method for an apparatus, comprising:
   receiving, by a gate/base terminal of a first transistor of the apparatus, a first drive control signal for controlling a driver stage of a transceiver to amplify a first radio frequency (RF) signal to be transmitted;
   in response to the first drive control signal being at a first level that enables the driver stage to amplify the first RF signal, switching on the first transistor of the apparatus; and
   in response to the first transistor being switched on, providing, by a drain/collector terminal of the first transistor of the apparatus, a switch control signal at a second level to a control terminal of a switch of the transceiver, wherein the switch control signal enables the switch of the transceiver to provide a portion of the first RF signal reflected by an antenna of the transceiver to a load of the transceiver other than to a low noise amplifier (LNA) of the transceiver.

14. The method of claim 13, wherein the driver stage includes a pre-driver and a driver and the pre-driver is controlled by the first drive control signal to amplify the first RF signal to a first power level, the method further comprising:
   receiving, by a gate/base terminal of a second transistor of the apparatus, a second drive control signal for controlling the driver to further amplify the first RF signal to a second power level higher than the first power level; and
   in response to the second drive control signal being at the first level that enables the driver to further amplify the first RF signal, switching on the second transistor of the apparatus, and
   wherein providing the switch control signal comprises, in response to the second transistor being switched on, providing the switch control signal at the second level to the control terminal of the switch.

15. The method of claim 13, further comprising:
   in response to the first drive control signal being at a third level that disables the driver stage, switching off the first transistor, and wherein providing the switch control signal comprises,
  receiving a further switch control signal, wherein the further switch control signal is generated for controlling the switch of the transceiver and is prevented from being provided to the switch, and
  in response to the first transistor being switched off, providing the switch control signal at a same level as the further switch control signal.

* * * * *